(12) United States Patent
Weimer et al.

(10) Patent No.: US 6,882,031 B2
(45) Date of Patent: Apr. 19, 2005

(54) AMMONIA GAS PASSIVATION ON NITRIDE ENCAPSULATED DEVICES

(75) Inventors: Ronald A. Weimer, Boise, ID (US); Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/012,665

(22) Filed: Oct. 30, 2001

(65) Prior Publication Data

US 2002/0074622 A1 Jun. 20, 2002

Related U.S. Application Data

(62) Division of application No. 09/650,784, filed on Aug. 30, 2000, now Pat. No. 6,544,908.

(51) Int. Cl.[7] .......................... H01L 29/06; H01L 29/94
(52) U.S. Cl. .................... 257/626; 257/405; 257/640; 257/645; 257/65; 438/798; 438/795
(58) Field of Search ................................. 257/626, 405, 257/56, 640, 645, 649, 65, 349; 438/798, 795, 253, 398, 719, 723, 395, 387, 396, 397

(56) References Cited

U.S. PATENT DOCUMENTS

| | | |
|---|---|---|
| 4,142,004 A | 2/1979 | Hauser, Jr. et al. |
| 4,551,231 A | 11/1985 | Kovach et al. |
| 4,623,912 A | 11/1986 | Chang et al. |
| 4,814,292 A | 3/1989 | Sasaki et al. |
| 4,872,043 A | 10/1989 | Fujii |
| 5,102,832 A | 4/1992 | Tuttle |
| 5,112,773 A | 5/1992 | Tuttle |
| 5,159,430 A | 10/1992 | Manning et al. |
| 5,264,724 A | 11/1993 | Brown et al. |
| 5,288,527 A | 2/1994 | Jousse et al. |

(Continued)

*Primary Examiner*—Minhloan Tran
*Assistant Examiner*—Tan Tran
(74) *Attorney, Agent, or Firm*—TraskBritt

(57) ABSTRACT

A passivation method includes disassociating ammonia so as to expose at least interfaces between silicon-containing and passivation structures to at least hydrogen species derived from the ammonia and forming an encapsulant layer that is positioned so as to substantially contain the hydrogen species in the presence of the interfaces. The hydrogen passivation reduces a concentration of dangling silicon bonds at the interfaces by as much as about two orders of magnitude or greater. The encapsulant layer, which may include silicon nitride, prevents hydrogen species from escaping therethrough as high temperature processes are subsequently conducted. Once high temperature processes have been completed, portions of the encapsulant layer may be removed, as needed, to provide access to features of the semiconductor device structure that underlie the encapsulant layer. Semiconductor device structures that have been passivated in such a manner are also disclosed.

18 Claims, 5 Drawing Sheets

U.S. PATENT DOCUMENTS

| | | | | |
|---|---|---|---|---|
| 5,352,330 | A | 10/1994 | Wallace | |
| 5,366,917 | A | 11/1994 | Watanabe et al. | |
| 5,385,863 | A | 1/1995 | Tatsumi et al. | |
| 5,397,720 | A | 3/1995 | Kwong et al. | |
| 5,445,999 | A | 8/1995 | Thakur et al. | |
| 5,462,898 | A | 10/1995 | Chen et al. | |
| 5,489,542 | A | 2/1996 | Iwai et al. | |
| 5,707,746 | A | 1/1998 | Yaoi et al. | |
| 5,707,898 | A | 1/1998 | Keller et al. | |
| 5,711,998 | A | 1/1998 | Shufflebotham | |
| 5,821,603 | A | 10/1998 | Puntambekar | |
| 5,880,008 | A | 3/1999 | Akiyama et al. | |
| 5,904,860 | A | 5/1999 | Nagakubo et al. | |
| 5,936,291 | A | 8/1999 | Makita et al. | |
| 5,946,542 | A | 8/1999 | Iyer | |
| 5,972,765 | A * | 10/1999 | Clark et al. | 438/308 |
| 5,972,804 | A | 10/1999 | Tobin | |
| 6,013,310 | A | 1/2000 | Yaoi et al. | |
| 6,017,784 | A | 1/2000 | Ohta et al. | |
| 6,017,808 | A | 1/2000 | Wang et al. | |
| 6,025,281 | A | 2/2000 | Passlack et al. | |
| 6,048,795 | A | 4/2000 | Numasawa et al. | |
| 6,060,954 | A | 5/2000 | Liu et al. | |
| 6,087,206 | A | 7/2000 | Hamada | |
| 6,136,641 | A | 10/2000 | Won et al. | |
| 6,143,608 | A | 11/2000 | He et al. | |
| 6,147,014 | A | 11/2000 | Lyding et al. | |
| 6,150,725 | A | 11/2000 | Misawa et al. | |
| 6,197,701 | B1 | 3/2001 | Shue et al. | |
| 6,204,203 | B1 | 3/2001 | Narwankar et al. | |
| 6,248,673 | B1 | 6/2001 | Huang et al. | |
| 6,251,726 | B1 * | 6/2001 | Huang | 257/384 |
| 6,255,230 | B1 | 7/2001 | Ikakura et al. | |
| 6,258,730 | B1 | 7/2001 | Sun et al. | |
| 6,265,327 | B1 | 7/2001 | Kobayashi et al. | |
| 6,274,442 | B1 | 8/2001 | Gardner et al. | |
| 6,278,166 | B1 | 8/2001 | Ogle, Jr. | |
| 6,284,583 | B1 | 9/2001 | Saida et al. | |
| 6,316,354 | B1 | 11/2001 | Hu | |
| 6,323,519 | B1 | 11/2001 | Gardner et al. | |
| 6,348,380 | B1 | 2/2002 | Weimer et al. | |
| 6,380,014 | B1 | 4/2002 | Ohta et al. | |
| 6,387,761 | B1 | 5/2002 | Shih et al. | |
| 6,420,752 | B1 | 7/2002 | Ngo et al. | |
| 6,444,533 | B1 | 9/2002 | Lyding et al. | |
| 6,465,370 | B1 | 10/2002 | Schrems et al. | |
| 6,482,477 | B1 | 11/2002 | Westhoff et al. | |
| 6,483,172 | B1 | 11/2002 | Cote et al. | |
| 6,485,988 | B1 | 11/2002 | Ma et al. | |
| 6,544,908 | B1 | 4/2003 | Weimer et al. | |
| 6,551,867 | B1 | 4/2003 | Ozeki et al. | |
| 6,559,007 | B1 * | 5/2003 | Weimer | 438/257 |

* cited by examiner

AMMONIA GAS PASSIVATION ON NITRIDE ENCAPSULATED DEVICES

CROSS-REFERENCE TO RELATED APPLICATION

This application is a divisional of application Ser. No. 09/650,784, filed Aug. 30, 2000, now U.S. Pat. No. 6,544,908, issued Apr. 8, 2003.

BACKGROUND OF THE INVENTION

1. Field of the Invention

The present invention relates in general to methods for passivating semiconductor device structures during fabrication thereof and, more particularly, to methods for passivating semiconductor-insulator interfaces in semiconductor device structures.

2. State of the Art

Insulative structures of semiconductor devices have long been formed from silicon-containing materials, such as silicon dioxide and silicon nitride. Silicon dioxide structures are typically fabricated by forming a silicon layer over a semiconductor device structure and oxidizing the silicon layer or by deposition processes that employ materials such as tetraethylorthosilicate (TEOS). Silicon dioxide layers so formed are then patterned by known processes to define insulative structures of the semiconductor device.

Silicon nitride insulative structures may be formed by first forming a layer of silicon on a semiconductor device structure, then nitridating the layer of silicon so as to form a silicon nitride layer. Conventionally, nitridation of silicon has been effected by exposing the silicon to nitrogen-free radicals from sources such as nitric oxide (NO), nitrous oxide ($N_2O$) and ammonia ($NH_3$). Free radicals may be generated from these nitrogen-containing species by use of plasmas. Once a silicon nitride layer has been formed, the silicon nitride layer may be patterned by known processes to form insulative structures of the semiconductor device.

Conventional semiconductor devices typically include conductive lines with thicknesses of at least about 0.25 microns. The insulative structures of the semiconductor devices, which are fabricated by conventional processes, have comparable thicknesses and impart to the semiconductor device the desired dielectric properties.

The trend in the semiconductor industry is toward fabricating semiconductor devices including structures of ever-decreasing size. While the widths of conductive lines of state-of-the-art semiconductor devices are currently in the range of about 0.25 microns down to about 0.18 microns, the widths of conductive lines and, thus, of the insulative structures adjacent thereto, are continuing to decrease. The goal in the industry is to decrease the thicknesses of conductive lines and their adjacent insulative structures down to dimensions that are measurable in terms of a few molecules or even single molecules.

In semiconductor device structures, the silicon-oxide interface contains interface states and surface defects caused by unsatisfied chemical bonds, or "dangling silicon bonds." Unsatisfied bonds in silicon atoms contribute to a charge at the oxide surface and the existence of the interface states cause the threshold voltage to fluctuate.

As the thicknesses of insulative structures of semiconductor devices decrease, dangling silicon bonds at interfaces between insulative structures and adjacent silicon structures, such as source/drain regions (i.e., n-wells and p-wells) and polysilicon conductive structures, become problematic. In conventional semiconductor devices, the dangling silicon bonds are present at concentrations of about $10^{11}$ to about $10^{12}$ per square centimeter. While these concentrations of dangling silicon bonds do not cause significant problems in conventional semiconductor devices, dangling silicon bonds may cause defects in much thinner insulative structures, which may cause electrical shorting in semiconductor devices including such thin insulative structures and, thus, failure of the semiconductor devices.

A common solution to this problem has been to passivate the interface by exposing the interface to high concentrations of molecular hydrogen ($H_2$), or hydrogen gas, which acts as a source for hydrogen atoms (H). The passivation is effected by rapid thermal processing ("RTP") and furnace tools before encapsulation with a thick nitride film. It is believed that the hydrogen atoms bond to the dangling silicon bonds to passivate the interface. Unfortunately, the use of $H_2$ raises serious safety concerns. The explosive nature of hydrogen gas narrows the window of acceptable process conditions involving its use. Argon or another inert gas can be mixed with $H_2$ to mitigate some of the safety risks, but this dilution reduces the overall rate of reaction, which results in unsatisfactory processing times. Additionally, hydrogen passivation must be done at the end of the processing of a semiconductor device structure. Otherwise, the hydrogen will escape from the interface region.

Moreover, the passivating hydrogen species are more readily driven from the passivated structures when a semiconductor device structure under fabrication is exposed to high process temperatures, such as processes that require temperatures of about 600° C. or greater.

Another method that has been proposed for passivating semiconductor device structures during fabrication thereof so as to prevent dangling silicon bonds from causing defects to be formed in insulative structures includes the use of deuterium species derived from molecular deuterium ($D_2$). When deuterium is used to passivate the various structures, including insulative structures, of a semiconductor device structure under fabrication, deuterium species, including deuterium-free radicals, permeate the various structures of the semiconductor device structure. It has been further proposed that by encapsulating deuterium-passivated structures with a suitable material, such as silicon nitride, the concentration of deuterium that permeates, and thus, passivates the semiconductor device structures will not be significantly diminished when the semiconductor device structure under fabrication is exposed to high process temperatures. Further, deuterium has been used to form silicon nitride layers by reaction with silane or dichlorosilane (DCS), ammonia, and molecular deuterium. Nonetheless, the use of molecular deuterium poses many of the same threats as those present during the use of molecular hydrogen.

Thus, it can be appreciated that it would be advantageous to develop a technique for passivating the silicon-silicon dioxide interface by trapping a passivating species at the interface using a method that mitigates the problems present in the prior art.

BRIEF SUMMARY OF THE INVENTION

The present invention includes a method for passivating with hydrogen species derived from ammonia ($NH_3$) semiconductor device structures under fabrication and, particularly, insulative structures of the semiconductor device structures. The method of the invention includes obtaining the hydrogen species from ammonia so as to allow the hydrogen species to permeate the semiconductor device structure under fabrication, as well as the insulative structures thereof, and forming an encapsulant layer over the semiconductor device structure so as to retain the hydrogen species within at least the insulative structures of the semiconductor device structure. The encapsulant may be formed following exposure of the semiconductor device structure to the hydrogen species or concurrently with exposure of the semiconductor device structure to the hydrogen species.

Hydrogen species, including hydrogen-free radicals, may be derived from ammonia by known processes. High temperature processes, for example, known rapid thermal processing (RTP) and other batch system techniques, may be employed. As hydrogen species from the ammonia permeate the semiconductor device structure, the concentration of dangling silicon bonds present at interfaces between silicon and silicon oxide structures is decreased from about $10^{11}$ to about $10^{12}$ dangling silicon bonds per square centimeter to about $10^9$ to about $10^{10}$ dangling silicon bonds per square centimeter, or to about 1% of the original concentration of dangling silicon bonds present at these interfaces. This represents a decrease in concentration of dangling silicon bonds of about two orders of magnitude.

As the passivating hydrogen species that permeate the semiconductor device structure, including the interfaces between the insulative and semiconductive structures thereof, tends to escape the semiconductor device structure upon exposure thereof to temperatures of greater than about 400° C. to greater than about 600° C., the method of the present invention preferably includes forming an encapsulant layer over hydrogen-passivated portions of the semiconductor device structure. The encapsulant layer may be formed in situ with the hydrogen passivation or in separate process equipment. Known techniques may be used to form the encapsulant layer. By way of example and not to limit the scope of the present invention, the encapsulant layer may comprise silicon nitride and may be formed by known techniques, such as by chemical vapor deposition (CVD) or by nitridation of a silicon layer. As a first example of the method of the present invention, the encapsulant layer may be formed directly over an insulative structure that forms an interface with a semiconductive structure for which hydrogen passivation is desired. In a variation of the method of the present invention, the encapsulant layer may be formed over additional structures that are formed subsequent to the fabrication of the insulative structure that forms an interface with a semiconductive structure, but before high temperature processes that would drive the passivating hydrogen from the semiconductor device structure are conducted. In another variation of the method, the encapsulant layer may be formed substantially simultaneously with the disassociation of ammonia to provide hydrogen species that will permeate and passivate the semiconductor device structure. In any event, the encapsulant layer preferably substantially completely covers a large-scale substrate, such as a semiconductor wafer, upon which a collection of semiconductor device structures are being fabricated.

Once a semiconductor device structure has been passivated and encapsulated in accordance with teachings of the present invention, high temperature processes may be effected. The hydrogen passivation and the accompanying encapsulation reduces or eliminates the occurrence of defects in thin insulative structures that could be attributed to exposure of dangling silicon bonds at interfaces between the insulative structures and adjacent semiconductive or conductive structures to temperatures of about 400° C. or greater. While some of the hydrogen species may escape through the backside of the semiconductor device structure or even through the encapsulant layer, the encapsulant layer is said to substantially contain the hydrogen species, or to substantially prevent the hydrogen species from escaping the semiconductor device structure.

Following the completion of high temperature fabrication processes on the semiconductor device structure and, thus, once the threat of defects being introduced into the insulative structures of the semiconductor device has passed, portions of the encapsulant layer may be removed so as to facilitate further fabrication of the semiconductor device structure.

The method of the present invention is useful in fabricating a variety of types of semiconductor device structures that have conductive lines and insulative structures of relatively small dimensions. By way of example and not to limit the scope of the present invention, the hydrogen-passivation method of the present invention may be employed in fabricating transistors, capacitors, polysilicon resistors, and thin-film transistors (TFTs), or polysilicon transistors.

In another aspect, the present invention includes methods for preventing unwanted voltage shifts, or changes across dielectric structures, such as the gate oxides of transistor gates of the dielectric layers of capacitors. As is known in the art, the presence of certain threshold voltages, or potential differences, across dielectric layers of such structures is desired. Unwanted changes in the voltage across a dielectric layer may occur if current leaks across the dielectric layer. For example, as the ratio between the amount of current that is required in changing the state of a transistor gate of a thin film from "off" to "on" is very small relative to the current ratio needed to shift a traditional semiconductor transistor gate from an "off" state to an "on" state, the presence of dangling silicon bonds above certain concentrations at the interfaces between insulative structures and semiconductive structures of thin-film transistors may cause defects that blur the distinction between the "off" state and the "on" state of the thin-film transistor. By employing the method of the present invention to passivate at least the interfaces between insulative structures and semiconductive structures of thin-film transistors, the concentration of dangling silicon bonds present at these interfaces is effectively reduced, as is the likelihood that the dangling silicon bonds could cause defects.

The present invention also includes semiconductor device structures with semiconductor-insulator interfaces that are exposed to disassociated ammonia species that are substantially contained by an encapsulant layer. Preferably, the concentration of dangling silicon bonds present at the encapsulated semiconductor-insulator interfaces of such a semiconductor device structure is about $10^{10}$ to about $10^9$ or less dangling silicon bonds per square centimeter.

In addition, the invention includes passivating structures that include disassociated ammonia species in the presence of an interface between a structure comprising semiconductive material silicon and an adjacent insulating structure, as well as an encapsulant layer substantially containing the disassociated ammonia species at least at the interface.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate exemplary embodiments of the present invention.

DETAILED DESCRIPTION OF THE INVENTION

Figure 1:
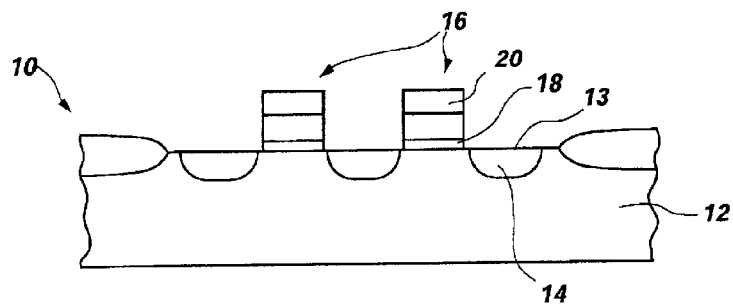
FIG. 1 is a cross-sectional representation of a semiconductor device structure that includes a substrate, conductively doped active areas formed in the substrate, and, between each adjacent pair of active areas, a transistor gate stack with a gate oxide adjacent the substrate and at least one conductive layer over the gate oxide.

Dangling silicon bonds at semiconductor-insulator interfaces cause a charge to be present at the interface. Depending upon the overall amount of charge, the presence of the charge at such interfaces may cause voltage shifts to occur. An unpassivated silicon-oxide interface will typically have between about $10^{11}$ and $10^{12}$ dangling silicon bonds/cm$^2$. The presence of a higher amount of dangling silicon bonds can have a catastrophic effect and render the semiconductor device structure inoperable. The present invention includes passivation methods for reducing the number of dangling silicon bonds that are present at semiconductor-insulator interfaces to between about $10^9$ and $10^{10}$ or even lower.

In the method of the present invention, ammonia (NH$_3$) is used as a passivating species. The use of ammonia as a passivating species reduces the number of dangling silicon bonds to between about $10^9$ and $10^{10}$ dangling silicon bonds/cm$^2$. In terms of a state-of-the-art semiconductor device structure, the presence of a passivating species in accordance with teachings of the present invention can improve the interface state such that only one or two dangling silicon bonds exist per transistor channel. The ammonia is disassociated to create hydrogen species, including hydrogen-free radicals. Disassociation of ammonia may be effected by use of heat, such as in rapid thermal processing (RTP), by use of dry furnace processes, by way of dry-wet-dry (DWD) processes, or by use of any known types of batch systems. By way of example only, a rapid thermal process may be conducted at a temperature of about 800° C. for a duration of about twenty seconds to disassociate ammonia in the desired manner.

The following TABLE compares the effects of ammonia disassociation and passivation of a gate oxide by rapid thermal processing to ammonia disassociation and passivation of gate oxides in substantially dry atmospheres at 850° C. for 30 minutes, 850° C. for 15 minutes, and 800° C. for 30 minutes, as well as to ammonia disassociation and passivation using a dry-wet-dry (DWD) process.

TABLE

Gateox Comparison

| Tox = 50 | NH$_3$ RTP | 850° C./ 30 min | 850° C./ 15 min | 800° C./ 30 min | DWD |
|---|---|---|---|---|---|
| Qf Gox | 5 | 4 | 3 | 2 | 1 |
| N in Gox | 5 | 4 | 3 | 2 | 1 |
| VTN | 0.52 | 0.60 | 0.63 | 0.65 | 0.85 |
| VTP | −0.67 | −0.60 | −0.55 | −0.52 | −0.10 |
| Qf Fox | 2 | 5 | 4 | 3 | 1 |
| N in Fox | 2 | 5 | 4 | 3 | 1 |
| K'LN | 39.0 | 34.0 | 35.0 | 37.0 | 40.0 |
| KLP | 11.9 | 11.5 | 12.2 | 12.3 | 13.5 |
| SVT SLPN | 78.0 | 85.0 | 84.0 | 82.0 | 78.0 |
| SVT SLPP | 79.0 | 81.0 | 82.0 | 82.0 | 85.0 |
| BV NDIODE | 10.0 | 11.0 | 10.8 | 10.8 | 9.8 |
| BV PDIODE | −10.1 | −9.8 | −9.9 | −9.9 | −10.2 |
| PT N + NW(2.0) | 13.0 | 4.8 | 7.5 | 8.3 | 16.0 |
| PT P + PW(−.6) | −8.6 | −17.2 | −14.2 | −14.2 | −6.3 |
| RES NW | 990.0 | 978.0 | 985.0 | 987.0 | 998.0 |
| RES NW | 594.0 | 613.0 | 610.0 | 607 | 587.0 |
| VTN Roll Off | −50 mV | 0.0 | 0.0 | 0.0 | +30 mV |
| VTP Roll Off | −90 mV | −100 mV | −100 mV | −100 mV | ? |

TABLE-continued

Gateox Comparison

| Tox = 50 | NH$_3$ RTP | 850° C./ 30 min | 850° C./ 15 min | 800° C./ 30 min | DWD |
|---|---|---|---|---|---|
| Narrow W Delta VTN* | +20 mV | −30 mV | −10 mV | 0.0 | 0.0 |
| Narrow W Delta VTP | 100 mV | 200 mV | ? | 160 mV | ? |

Referring to FIG. 1, a first embodiment of a hydrogen-passivated semiconductor device structure 10 incorporating teachings of the present invention is illustrated. Semiconductor device structure 10 is a transistor including a semiconductor substrate 12 including an active surface 13 and active device regions 14, such as N-doped wells or P-doped wells, that are contiguous with active surface 13. Active device regions 14 are separated from one another by undoped material of substrate 12 or by oppositely doped material of substrate 12. Semiconductor device structure 10 also includes a gate stack 16 located on active surface 13 between a pair of adjacent active device regions 14. Gate stack 16 includes an insulative, or gate oxide, layer 18 disposed on active surface 13 and at least one conductive layer 20 positioned over insulative layers 18.

Figure 2:
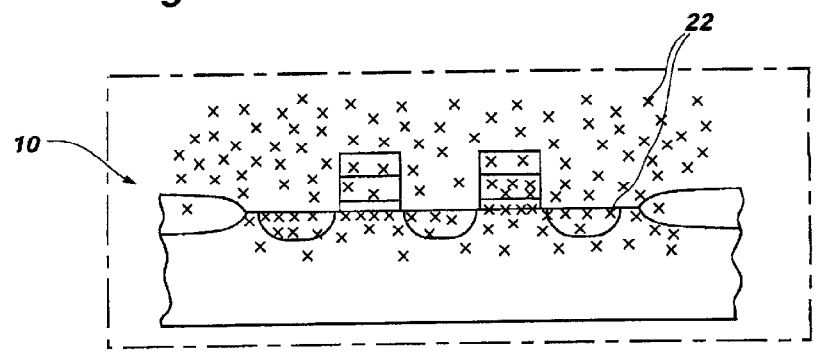
FIG. 2 is a cross-sectional representation of the semiconductor device structure shown in FIG. 1, illustrating use of the method of the present invention to passivate at least interfaces between semiconductive structures and insulative structures with hydrogen.

Referring now to FIG. 2, each of the features of semiconductor device structure 10, which has not undergone complete fabrication, is permeated with a passivating hydrogen species 22 derived from ammonia (NH$_3$).

Figure 3:
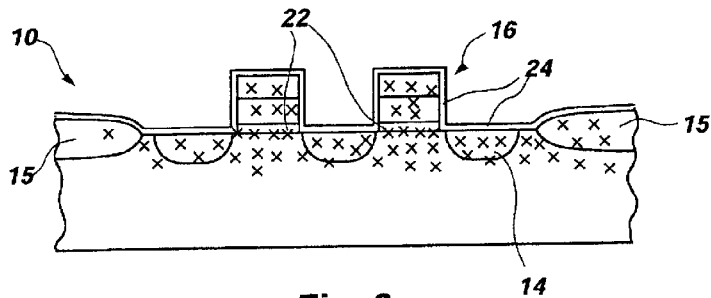
FIG. 3 is a cross-sectional representation of the semiconductor device structure depicted in FIG. 2, illustrating an encapsulant layer formed over the gate stacks and previously exposed portions of the substrate.

In addition, as shown in FIG. 3, semiconductor device structure 10 includes an encapsulant layer 24 located over exposed portions of active device regions 14, gate stacks 16, and other common features of a semiconductor memory device structure, such as field oxides 15 or other isolation structures thereof. Preferably, encapsulant layer 24 has a thickness of about 20 Å or less. Encapsulant layer 24 is formed from a material that will substantially prevent escape of passivating hydrogen species 22 from portions of semiconductor device structure 10 permeated therewith as semiconductor device structure 10 is exposed to temperatures of about 400° C. or greater. Preferably, encapsulant layer 24 substantially prevents the escape of passivating hydrogen species 22 from underlying portions of semiconductor device structure 10 during exposure of semiconductor device structure 10 to temperatures of about 600° C. or greater. By way of example and not to limit the scope of the present invention, encapsulant layer 24 may include silicon nitride.

Figure 4:
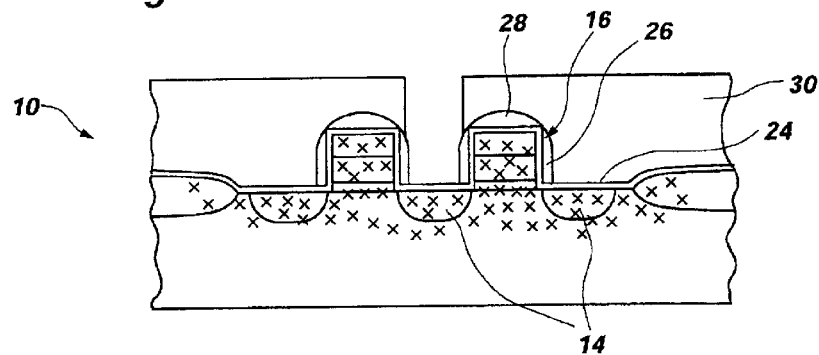
FIG. 4 is a cross-sectional representation of the semiconductor device structure of FIG. 3, showing subsequently formed structures, some of which are fabricated using high temperature processes.

Turning now to FIG. 4, high temperature processes may be employed to subsequently fabricate other structures over at least gate stack 16. As shown, sidewall spacers 26, or simply sidewalls, and gate caps 28 may be fabricated over portions of encapsulant layer 24 that cover gate stack 16. Likewise, an insulative layer 30 may be fabricated over each gate stack 16 and its sidewall spacers 26 and insulative gate cap 28. For example, insulative layer 30 may be fabricated from a glass, such as borophosphosilicate glass (BPSG), borosilicate glass (BSG), or phosphosilicate glass (PSG), or another insulative material such as a silicon oxide, a silicon nitride, a silicon oxinitride, or any other material that is suitable as an electrical insulator in semiconductor device structures. In addition, material of sidewall spacers 26, insulative gate cap 28, or insulative layer 30 that overlie active device regions 14 maybe removed therefrom, as known in the art, such as by use of known wet or dry etching processes.

Figure 5:
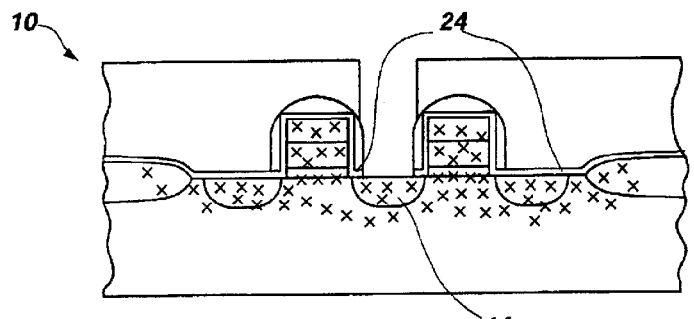
FIG. 5 is a cross-sectional representation of the semiconductor device structure shown in FIG. 4, showing portions of the encapsulant layer removed from over the active areas of the substrate following the use of high temperature processes to fabricate structures of the semiconductor device structure.

Once all of the fabrication processes that exceed a temperature of about 400° C. or greater have been completed, portions of encapsulant layer 24 that overlie at least active device regions 14 may be removed, as shown in FIG. 5, to facilitate the fabrication of contacts (not shown) to active device regions 14.

Figure 6:
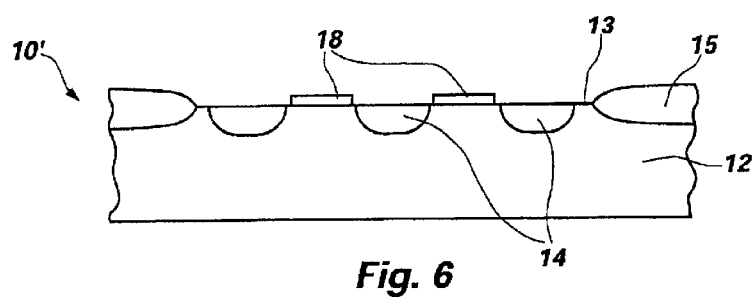
FIG. 6 is a cross-sectional representation illustrating passivation of semiconductor-insulator interfaces of an exemplary embodiment of a semiconductor device structure, including a substrate with conductively doped active regions formed therein for use in a transistor and an insulative layer formed over the substrate and the active regions for subsequent use as a gate oxide between adjacent active regions of the same transistor.

Turning now to FIG. 6, an alternative method for hydrogen-passivating a semiconductor device structure 10' in accordance with teachings of the present invention is illustrated. Semiconductor device structure 10', which comprises at least one transistor, includes a semiconductor substrate 12 with an active surface 13 and one or more conductively doped active device regions 14, which are contiguous with active surface 13, formed in semiconductor substrate 12. Semiconductor device structure 10' may also include field oxides 15. In addition, semiconductor device structure 10' may include a gate oxide layer 18 formed on active surface 13 between an adjacent pair of active device regions 14.

Figure 7:
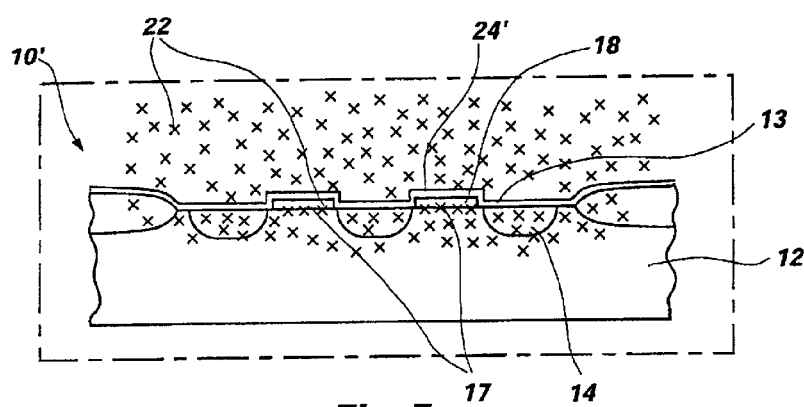
FIG. 7 is a cross-sectional representation of the semiconductor device structure of FIG. 6, depicting hydrogen-passivated encapsulation of at least the interfaces.

With reference to FIG. 7, in practicing the method of the present invention, semiconductor device structure 10' is hydrogen-passivated by deriving passivating hydrogen species 22 from ammonia and permeating each of the features of semiconductor device structure 10' and, particularly, an interface 17 between gate oxide layer 18 and active surface 13 of substrate 12 with passivating hydrogen species 22.

As shown in FIG. 7, as the features of semiconductor device structure 10' are hydrogen-passivated, an encapsulant layer 24' may be formed over exposed portions of active device regions 14 and gate oxide layer 18, as well as over other exposed features of semiconductor device structure 10'. Encapsulant layer 24', which is configured to substantially prevent passivating hydrogen species 22 from escaping interface 17 and other areas of semiconductor device structure 10' as high temperature processes are being conducted, is fabricated from a suitable material, such as a silicon nitride.

Figure 8:
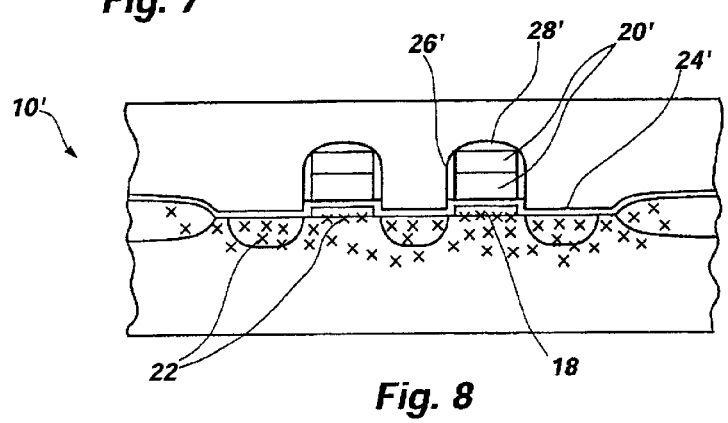
FIG. 8 is a cross-sectional representation of the semiconductor device structure illustrated in FIG. 7, showing additional structures that are fabricated following hydrogen passivation and encapsulation.

FIG. 8 illustrates a conductive layer 20' overlying gate oxide layer 18, sidewall spacers 26' adjacent sides of conductive layer 20', and an insulative gate cap 28' formed over conductive layer 20'. Each of these features of semiconductor device structure 10' may be fabricated by known processes, including high temperature processes that would otherwise facilitate the migration of passivating hydrogen species 22 from the passivated structures underlying encapsulant layer 24'.

Figure 9:
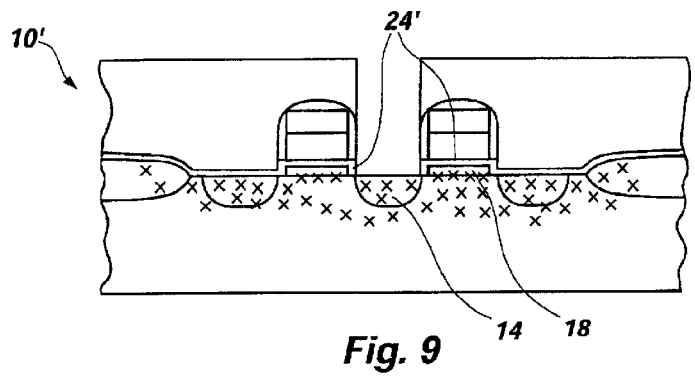
FIG. 9 is a cross-sectional representation of the semiconductor device structure shown in FIG. 8, depicting the formation of contact openings through the encapsulant layer.

Following the completion of fabrication processes that require a temperature of greater than about 400° C., portions of encapsulant layer 24' overlying active device regions 14, as well as portions of encapsulant layer 24' that overlie other features of semiconductor device structure 10', may be removed, as illustrated in FIG. 9. Removal of portions of encapsulant layer 24' from above active device regions 14 facilitates the fabrication of contact structures (not shown) that communicate with active device regions 14.

In order for a completed semiconductor device structure 10' including the illustrated transistor to function properly, the combined thicknesses and dielectric constant of gate oxide layer 18 and the portions of encapsulant layer 24' that directly overlie and are adjacent to gate oxide layer 18, preferably impart the transistor with the desired electrical properties.

Figure 10:
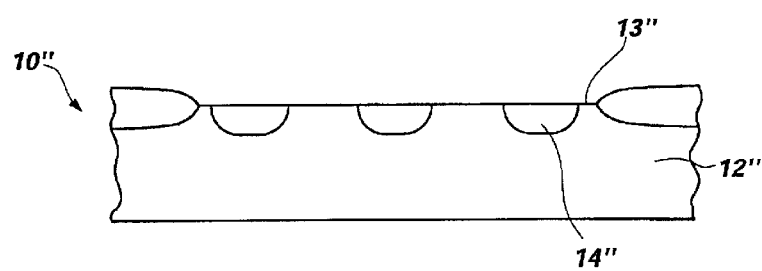
FIG. 10 is a cross-sectional representation of a semiconductor device structure including a substrate with conductively doped active regions formed therein for use in a transistor.
Figure 11:
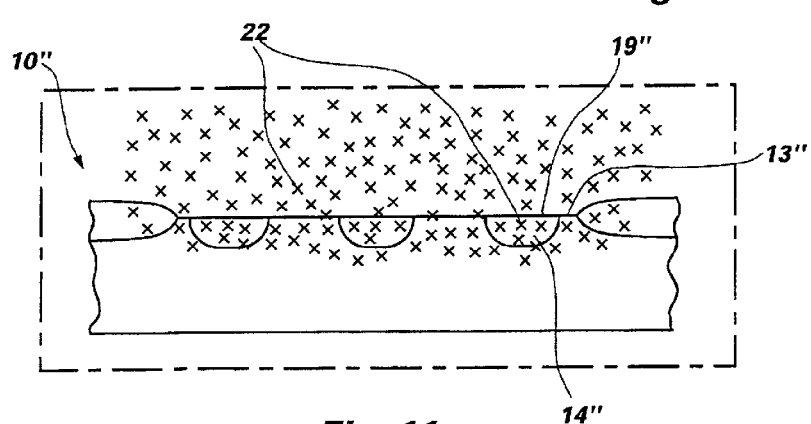
FIG. 11 is a cross-sectional representation of the semiconductor device shown in FIG. 10, depicting hydrogen passivation of the surface of the substrate.
Figure 12:
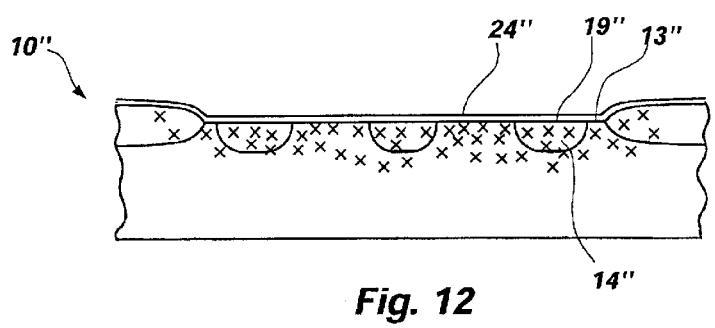
FIG. 12 is a cross-sectional representation of the semiconductor device shown in FIG. 11, depicting an encapsulant/insulative layer over the hydrogen-passivated substrate.

Another use of the method of the present invention in passivating a transistor structure is illustrated in FIGS. 10–12. In FIG. 10, a semiconductor device structure 10", which comprises at least one transistor, is illustrated. Semiconductor device structure 10″ includes a semiconductor substrate 12″ with an active surface 13″ and conductively doped active device regions 14″ formed therein and contiguous with active surface 13″. Turning to FIG. 11, at least the portions of active surface 13″ that comprise surfaces 19″ of active device regions 14″ are passivated with hydrogen species 22 derived from ammonia, in accordance with teachings of the present invention. As shown in FIG. 12, an encapsulant layer 24″ may then be fabricated over active surface 13″ so as to substantially contain the passivating hydrogen species 22 in the presence of surfaces 19″ of active device regions 14″. Encapsulant layer 24″ may be formed from a material that will substantially prevent the passivating hydrogen species 22 from escaping at least surfaces 19″ as semiconductor device structure 10″ undergoes high temperature processes. Silicon nitrides are examples of suitable material for use in encapsulant layer 24″. Once encapsulant layer 24″ has been fabricated, the remaining features of the transistors may be fabricated, as known in the art, with the exception of the conventional gate oxides, which will instead be formed by encapsulant layer 24″ as active device regions 14″ are exposed during the subsequent formation of contact openings thereover. Of course, since encapsulant layer 24″ is also employed as a gate oxide layer, the thickness of encapulsant layer 24″ should be appropriate for the desired characteristics of a transistor gate structure (not shown) and may be determined, as known in the art, such as by considering at least the dielectric constant of the material or materials of encapsulant layer 24″.

Figure 13:
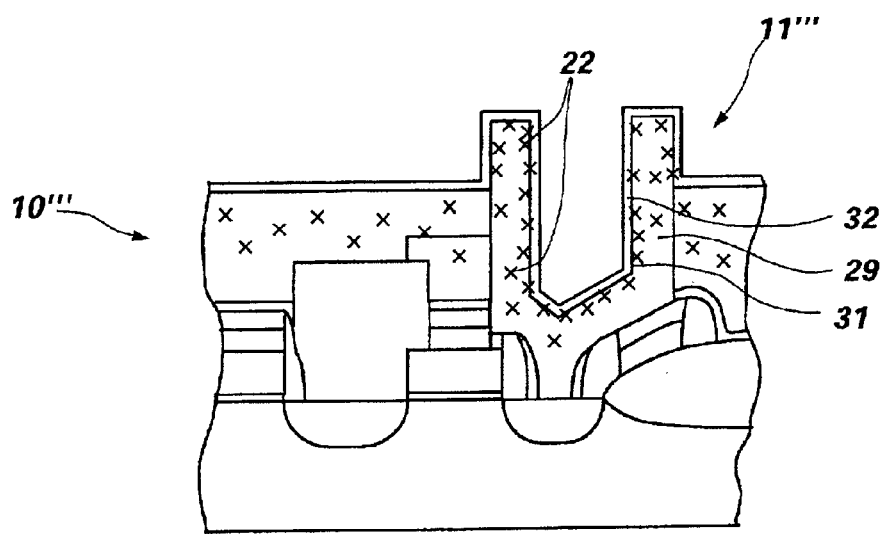
FIG. 13 is a cross-sectional representation of a capacitor structure under fabrication, the interfaces between semiconductive structures and insulative structures of the capacitor having been passivated with hydrogen and encapsulated in accordance with teachings of the present invention.

FIG. 13 depicts a semiconductor device structure 10‴ including a capacitor structure 11‴ under construction, with a first electrode 29 and an interlayer dielectric 32 positioned over first electrode 29. As first electrode 29 may be formed from a material such as polysilicon, dangling silicon bonds may be present at an interface 31 between first electrode 29 and interlayer dielectric 32.

Figure 14:
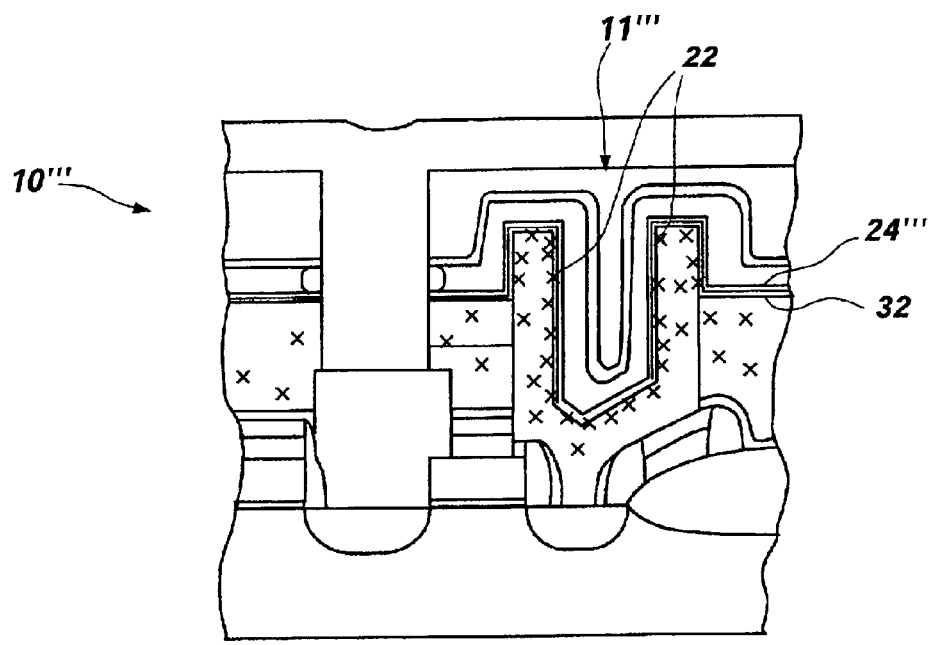
FIG. 14 is a cross-sectional representation of a finished capacitor structure of the type shown in FIG. 13.

Semiconductor device structure 10‴ and, particularly, interface 31 may be hydrogen-passivated in accordance with teachings of the present invention. Specifically, the features of semiconductor device structure 10‴, including interface 31, may be permeated with passivating hydrogen species 22 derived from ammonia. As shown in FIG. 14, an encapsulant layer 24‴ may be formed over interlayer dielectric 32 so as to substantially prevent the passivating hydrogen species 22 from escaping semiconductor device structure 10‴ as high temperature processes, such as processes that require temperatures of greater than about 400° C. or of greater than about 600° C. are performed. Encapsulant layer 24‴ may comprise silicon nitride and may be formed following the permeation of semiconductor device structure 10‴ with the passivating hydrogen species 22 or substantially simultaneously with such passivating. Of course, the combined thicknesses of interlayer dielectric 32 and encapsulant layer 24‴, as well as the collective dielectric constants of these layers, impart to capacitor structure 11‴ the overall desired dielectric properties for a dielectric layer thereof. Following the occurrence of high temperature processes, such as processes that require temperatures of greater than about 400° C. or greater than about 600° C., portions of encapsulant layer 24‴ may be removed, as necessary, to complete fabrication of semiconductor device structure 10‴.

Figure 15:
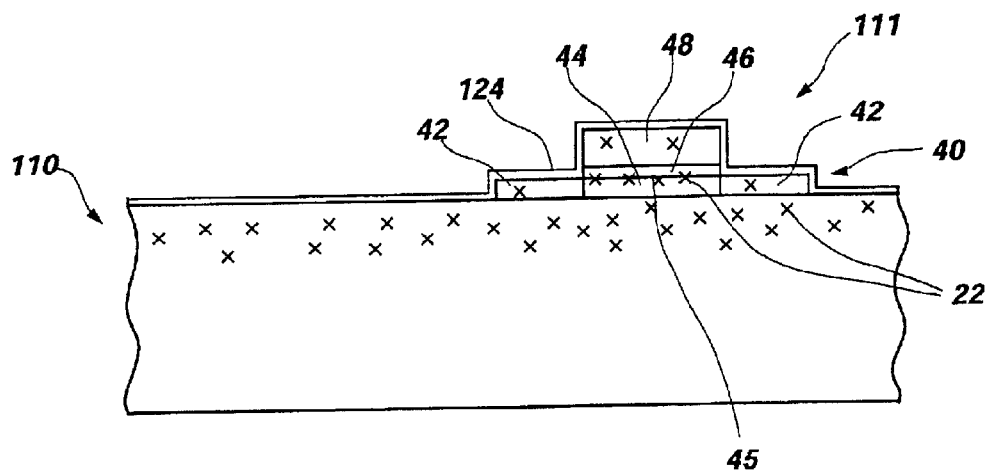
FIG. 15 is a cross-sectional representation of a polysilicon thin-film transistor under fabrication, the interfaces between semiconductive structures and insulative structures of the thin-film transistor having been passivated with hydrogen and encapsulated in accordance with teachings of the present invention.

Turning now to FIG. 15, another exemplary embodiment of a semiconductor device structure 110 that may benefit from the hydrogen-passivation processes of the present invention is illustrated. Semiconductor device structure 110 comprises a thin-film transistor 111, which includes a layer 40 of recrystallized amorphous silicon or polysilicon with two conductively doped active device regions 42 spaced apart from one another by a region 44 of either undoped material of layer 40 or by material of layer 40 having an opposite conductivity type as that of active device regions 42. Thin-film transistor 111 also includes a gate oxide 46 disposed over region 44 and a conductive layer 48 over gate oxide 46.

With continued reference to FIG. 15, semiconductor device structure 110, including thin-film transistor 111, may be hydrogen-passivated in accordance with teachings of the present invention, as described previously herein. An encapsulant layer 124 may be formed by known processes, such as those previously disclosed herein, over active device regions 42 and conductive layer 48. Alternatively, an encapsulant layer may be formed over active device regions 42 and between gate oxide 46 and conductive layer 48. As another alternative, an encapsulant layer according to the present invention may be fabricated over layer 40 and may comprise a gate dielectric that replaces gate oxide 46 illustrated in FIGS. 15 and 16. In any event, an encapsulant layer, such as encapsulant layer 124, substantially prevents the passivating hydrogen species 22 that permeates active device regions 42 and region 44 of layer 40, as well as an interface 45 between gate oxide 46 or another gate dielectric, from escaping semiconductor device structure 110 as high temperature (e.g., greater than about 400° C. or greater than about 600° C.) processes are conducted to fabricate additional features of semiconductor device structure 110. These encapsulant layers may be fabricated substantially simultaneously with the permeation of these features of semiconductor device structure 110 with the passivating hydrogen species 22 or thereafter.

Figure 16:
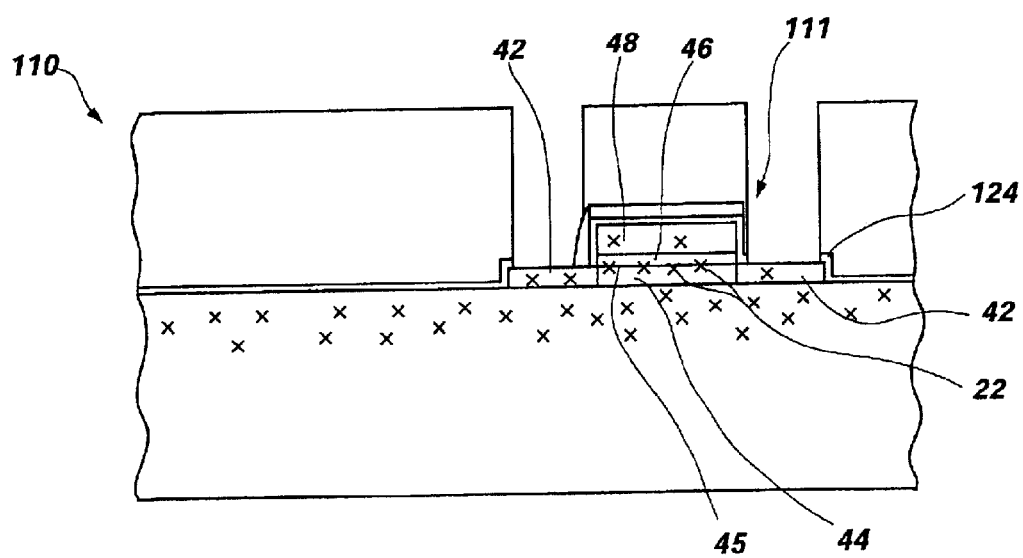
FIG. 16 is a cross-sectional representation of a finished thin-film transistor of the type shown in FIG. 15.

Referring now to FIG. 16, once additional features of thin-film transistor 111 have been fabricated and high temperature processes have been completed, portions of encapsulant layer 124 or alternatively positioned encapsulant layers may be removed, as needed, to provide access to underlying structures, such as one or more of active device regions 42.

In addition to improving the dielectric properties of thin dielectric layers of thin-film transistor 111, the use of passivating hydrogen species 22 to passivate the various features of thin-film transistor 111 and the use of encapsulant layer 124 to contain the passivating hydrogen species 22 during high temperature fabrication processes also reduces the leakage of electrons across the gate dielectric and, thus, increases the drive current of thin-film transistor 111. As a result, the amount of current that passes through conductive layer 48 of thin-film transistor 111 when thin-film transistor 111 is in an "on" state is significantly greater than the amount of current that may be conducted through conductive layer 48 when thin-film transistor 111 is in an "off" state and, consequently, the reliability of thin-film transistor 111 is increased.

The hydrogen passivation methods of the present invention may also be used to passivate at least interfaces between dielectric structures or layers and adjacent semiconductive or conductive structures or layers that contain silicon.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, It is claimed:

1. A semiconductor device structure, comprising:
   a first structure comprising at least one of a semiconductive material and a conductive material;
   a second structure adjacent the first structure, the second structure comprising insulative material and forming an interface with at least a portion of the first structure;
   passivation species permeating at least a portion of the first structure at the interface, the passivation species comprising hydrogen species derived from ammonia such that a concentration of dangling silicon bonds present at the at least a portion of the first structure is at most about $10^9$ to about $10^{10}$ dangling silicon bonds per square centimeter; and
   an encapsulant layer positioned over at least the first structure so as to substantially contain the passivation species in the presence of at least the portion of the first structure.

2. The semiconductor device structure of claim 1, wherein the second structure comprises the encapsulant layer.

3. The semiconductor device structure of claim 1, wherein the encapsulant layer comprises silicon nitride.

4. The semiconductor device structure of claim 1, wherein the first structure comprises semiconductive material and the second structure comprises a transistor gate oxide.

5. The semiconductor device structure of claim 1, wherein the first structure comprises a capacitor electrode and the second structure comprises a capacitor dielectric.

6. The semiconductor device structure of claim 1, wherein the hydrogen species prevents unwanted changes in voltage across the second structure.

7. The semiconductor device structure of claim 1, wherein the encapsulant layer substantially prevents the hydrogen species from passing therethrough at process temperatures of at least about 600° C.

8. The semiconductor device structure of claim 1, wherein the encapsulant layer substantially prevents the hydrogen species from passing therethrough at process temperatures of at least about 400° C.

9. A passivating system for use in semiconductor device structures, comprising:
   hydrogen species derived from ammonia for permeating and passivating at least an interface between a first structure comprising at least one of a semiconductive material and a conductive material and a second structure comprising an insulative material, such that the hydrogen species reduces a concentration of dangling silicon bonds at the interface by about two orders of magnitude; and
   an encapsulant layer positioned so as to substantially prevent the hydrogen species from escaping the interface.

10. The passivating system of claim 9, wherein the encapsulant layer comprises a silicon nitride.

11. The passivating system of claim 9, wherein the encapsulant layer is configured to substantially contain the hydrogen species at process temperatures of at least about 600° C.

12. The passivating system of claim 9, wherein the encapsulant layer is configured to substantially contain the hydrogen species at process temperatures of at least about 400° C.

13. The passivating system of claim 9, wherein the second structure comprises the encapsulant layer.

14. The passivating system of claim 9, wherein the hydrogen species substantially prevents unwanted voltage changes across the second structure.

15. The passivating system of claim 9, wherein the first structure comprises semiconductive material and the second structure comprises a transistor gate oxide.

16. The passivating system of claim 9, wherein the first structure comprises a capacitor electrode and the second structure comprises a capacitor dielectric.

17. The passivating system of claim 9, wherein the encapsulant layer has a thickness of about 20 angstroms or less.

18. The passivating system of claim 9, wherein the hydrogen species reduces a concentration of dangling silicon bonds present at the interface to at most about $10^9$ to about $10^{10}$.

* * * * *

UNITED STATES PATENT AND TRADEMARK OFFICE
CERTIFICATE OF CORRECTION

PATENT NO.         : 6,882,031 B2
APPLICATION NO. : 10/012665
DATED                : April 19, 2005
INVENTOR(S)       : Ronald A. Weimer and Fernando Gonzalez It is certified that error appears in the above-identified patent and that said Letters Patent is hereby corrected as shown below:

On the title page:
In item (56) References Cited, add the following section after U.S. PATENT DOCUMENTS:

--OTHER PUBLICATIONS--

--Cheng et al., "Effects of $NH_3$ Plasma Passivation on N-Channel Polycrystalline Silicon Thin-Film Transistors," IEEE, Vol. 44, No. 1, January 1997, pp. 64-68.--
--Intel Corporation, "Intel StratFlash$^{TM}$ Memory Development and Implementation," http:/www.chips.com/technology/itj/y41997/articles/art_2b.htm, December 9, 1999; pp.1-5.--
--Chevalier, "Electroless Gold Plating," Plating and Electroplating, pp. 323-325.--
--Lifshitz et al., "Detection of water-related charge in electronic dielectrics," *Appl. Phys. Lett.*, Vol. 55, Issue 4, July 24, 1989, pp. 408-410.--
--Momose et al., "Very Lightly Nitrided Oxide Gate Mosfets For Deep-sub-micron CMOS Devices," IEDM, 1991, pp.359-362.--
--VanHeusden et al., "Positive charging of buried $SiO_2$ by hydrogenation," *Appl. Phys. Lett.*, Vol. 64, No. 19, May 9, 1994, pp. 2575-2577.--
--Vines et al., "Platinum Metals," Chapter 13 of Characteristics of the Platinum Metals, pp. 342-356.--
--Sakai et al., "Novel seeding method for the growth of polycrystalline Si films with hemispherical grains," *Appl. Phys. Lett.*, Vol. 61, No. 2, July 13, 1992, pp. 159-161.--
--"Superconducting RF Cavities: A Primer, Basics of SRF Cavities 3.1: Fowler-Nordheim Theory," http://www.lns.cornell.edu/public/CESR/SRF/BasicSRF/SRFBas3l.html, December 9, 1999.--

UNITED STATES PATENT AND TRADEMARK OFFICE
CERTIFICATE OF CORRECTION

PATENT NO. : 6,882,031 B2
APPLICATION NO. : 10/012665
DATED : April 19, 2005
INVENTOR(S) : Ronald A. Weimer and Fernando Gonzalez It is certified that error appears in the above-identified patent and that said Letters Patent is hereby corrected as shown below:

On the title page (continued):
In item (56) References Cited, add the following section after U.S. PATENT DOCUMENTS:

--OTHER PUBLICATIONS--

--Watanabe et al., "Hemispherical Grained Si Formation on in-situ Phosphorous Doped Amorphous-Si Electrode for 256Mb DRAM's Capacitor," IEEE Transactions on Electron Devices, Vol. 42, No. 7, July 1995, pp. 1247-1254.--

Signed and Sealed this

Fourth Day of December, 2007

JON W. DUDAS
*Director of the United States Patent and Trademark Office*